(12) United States Patent
Liu et al.

(10) Patent No.: US 9,660,106 B2
(45) Date of Patent: May 23, 2017

(54) FLASH MEMORY AND METHOD OF MANUFACTURING THE SAME

(71) Applicant: UNITED MICROELECTRONICS CORP., Hsin-Chu (TW)

(72) Inventors: Weichang Liu, Singapore (SG); Zhen Chen, Singapore (SG); Shen-De Wang, Hsinchu County (TW); Wei Ta, Singapore (SG); Yi-Shan Chiu, Taoyuan County (TW); Yuan-Hsiang Chang, Hsinchu (TW)

(73) Assignee: UNITED MICROELECTRONICS CORP., Hsin-Chu, Taiwan (CN)

( * ) Notice: Subject to any disclaimer, the term of this patent is extended or adjusted under 35 U.S.C. 154(b) by 0 days.

(21) Appl. No.: 14/462,550

(22) Filed: Aug. 18, 2014

(65) Prior Publication Data

US 2016/0049525 A1 Feb. 18, 2016

(51) Int. Cl.
| | |
|---|---|
| *H01L 29/792* | (2006.01) |
| *H01L 29/66* | (2006.01) |
| *H01L 29/423* | (2006.01) |
| *H01L 29/51* | (2006.01) |
| *H01L 29/49* | (2006.01) |
| *H01L 21/28* | (2006.01) |
| *H01L 27/11573* | (2017.01) |
| *H01L 21/311* | (2006.01) |

(52) U.S. Cl.
CPC ...... *H01L 29/792* (2013.01); *H01L 21/28282* (2013.01); *H01L 27/11573* (2013.01); *H01L 29/42344* (2013.01); *H01L 29/4916* (2013.01); *H01L 29/513* (2013.01); *H01L 29/518* (2013.01); *H01L 29/66833* (2013.01); *H01L 21/31105* (2013.01); *H01L 21/31144* (2013.01)

(58) Field of Classification Search
CPC ............................ H01L 29/792; H01L 29/788
See application file for complete search history.

(56) References Cited

U.S. PATENT DOCUMENTS

| | | | | | |
|---|---|---|---|---|---|
| 4,368,085 | A | * | 1/1983 | Peel | H01L 27/12 148/33.3 |
| 5,408,115 | A | * | 4/1995 | Chang | H01L 27/115 257/314 |
| 5,703,388 | A | * | 12/1997 | Wang | H01L 21/28282 257/315 |
| 5,869,369 | A | * | 2/1999 | Hong | H01L 29/42324 257/E21.422 |
| 6,001,690 | A | * | 12/1999 | Chien | H01L 29/66825 257/E21.422 |
| 6,069,042 | A | * | 5/2000 | Chien | H01L 29/66825 257/E21.422 |
| 6,074,914 | A | * | 6/2000 | Ogura | H01L 21/28273 257/E21.209 |

(Continued)

*Primary Examiner* — Matthew Landau
*Assistant Examiner* — Grant Withers
(74) *Attorney, Agent, or Firm* — Winston Hsu; Scott Margo

(57) ABSTRACT

A flash memory structure includes a memory gate on a substrate, a select gate adjacent to the memory gate, and an oxide-nitride spacer between the memory gate and the select gate, where the oxide-nitride spacer further includes an oxide layer and a nitride layer having an upper nitride portion and a lower nitride portion, and the upper nitride portion is thinner than the lower nitride portion.

12 Claims, 4 Drawing Sheets

(56) References Cited

U.S. PATENT DOCUMENTS

| | | | | |
|---|---|---|---|---|
| 6,091,104 A * | 7/2000 | Chen | G11C 16/0433 | 257/321 |
| 6,245,614 B1 * | 6/2001 | Hsieh | H01L 27/115 | 257/E21.682 |
| 6,255,172 B1 * | 7/2001 | Huang | H01L 29/66825 | 257/E21.209 |
| 6,255,689 B1 * | 7/2001 | Lee | H01L 27/115 | 257/314 |
| 6,271,088 B1 * | 8/2001 | Liu | H01L 21/28273 | 257/E21.209 |
| 6,399,441 B1 * | 6/2002 | Ogura | H01L 21/28202 | 257/E21.21 |
| 6,465,841 B1 * | 10/2002 | Hsieh | H01L 21/28273 | 257/315 |
| 6,828,618 B2 * | 12/2004 | Baker, Jr. | G11C 16/0425 | 257/311 |
| 7,030,444 B2 * | 4/2006 | Tu | H01L 21/28273 | 257/201 |
| 7,208,371 B2 * | 4/2007 | Jung | H01L 27/115 | 257/E21.645 |
| 7,488,634 B2 * | 2/2009 | Shin | H01L 21/28185 | 257/411 |
| 7,816,947 B1 * | 10/2010 | Wang | H01L 21/28273 | 326/122 |
| 8,669,607 B1 * | 3/2014 | Tsair | H01L 29/7881 | 257/316 |
| 8,895,397 B1 * | 11/2014 | Shum | H01L 27/11563 | 438/279 |
| 8,999,833 B1 * | 4/2015 | Wu | H01L 29/42328 | 257/E21.209 |
| 9,012,324 B2 * | 4/2015 | Chen | H01L 23/49827 | 438/667 |
| 9,196,748 B2 * | 11/2015 | Saito | H01L 29/788 | |
| 2002/0149061 A1 * | 10/2002 | Ogura | G11C 16/0466 | 257/365 |
| 2005/0282337 A1 * | 12/2005 | Shyu | H01L 27/115 | 438/257 |
| 2006/0073666 A1 * | 4/2006 | Lim | G11C 16/0466 | 438/303 |
| 2006/0131672 A1 * | 6/2006 | Wang | H01L 21/28202 | 257/410 |
| 2006/0284244 A1 * | 12/2006 | Forbes | H01L 21/28282 | 257/324 |
| 2007/0013010 A1 * | 1/2007 | Wang | H01L 29/41766 | 257/408 |
| 2007/0228446 A1 * | 10/2007 | Toba | H01L 21/28273 | 257/314 |
| 2007/0231999 A1 * | 10/2007 | Wang | H01L 29/1054 | 438/261 |
| 2008/0164523 A1 * | 7/2008 | Lin | H01L 21/84 | 257/347 |
| 2008/0258227 A1 * | 10/2008 | Wang | H01L 21/82380 | 257/369 |
| 2009/0050955 A1 * | 2/2009 | Akita | H01L 27/115 | 257/324 |
| 2009/0090962 A1 * | 4/2009 | Kikuchi | H01L 27/11568 | 257/324 |
| 2009/0121278 A1 * | 5/2009 | Lin | H01L 21/28282 | 257/324 |
| 2010/0054043 A1 * | 3/2010 | Liu | H01L 21/28273 | 365/185.29 |
| 2011/0121382 A1 * | 5/2011 | Chakihara | G11C 16/0466 | 257/326 |
| 2012/0018795 A1 * | 1/2012 | Chen | H01L 21/28282 | 257/324 |
| 2012/0068243 A1 * | 3/2012 | Kawashima | H01L 27/11573 | 257/315 |
| 2012/0299084 A1 * | 11/2012 | Saito | H01L 21/28282 | 257/324 |
| 2013/0056837 A1 * | 3/2013 | Ng | H01L 21/82380 | 257/410 |
| 2013/0082315 A1 * | 4/2013 | Hosoda | H01L 29/66833 | 257/315 |
| 2013/0084697 A1 * | 4/2013 | Shen | H01L 21/28273 | 438/591 |
| 2013/0329499 A1 * | 12/2013 | Lee | H01L 27/11563 | 365/185.17 |
| 2014/0175531 A1 * | 6/2014 | Huang | H01L 21/28282 | 257/324 |
| 2014/0197472 A1 * | 7/2014 | Chang | H01L 29/4234 | 257/324 |
| 2014/0198574 A1 * | 7/2014 | Wang | G11C 16/0475 | 365/185.15 |
| 2014/0239367 A1 * | 8/2014 | Saito | H01L 29/788 | 257/319 |
| 2014/0291749 A1 * | 10/2014 | Khare | H01L 29/792 | 257/324 |
| 2014/0291750 A1 * | 10/2014 | Khare | H01L 29/792 | 257/324 |
| 2015/0008509 A1 * | 1/2015 | Charpin-Nicolle | H01L 21/28282 | 257/326 |
| 2015/0014761 A1 * | 1/2015 | Hsu | H01L 21/28273 | 257/316 |
| 2015/0048439 A1 * | 2/2015 | Shum | H01L 29/7816 | 257/326 |
| 2015/0129953 A1 * | 5/2015 | Owada | H01L 29/4234 | 257/326 |
| 2015/0137206 A1 * | 5/2015 | Liu | H01L 29/788 | 257/316 |
| 2015/0155394 A1 * | 6/2015 | Tsai | H01L 29/792 | 257/326 |
| 2015/0179748 A1 * | 6/2015 | Chang | H01L 29/66833 | 438/591 |
| 2015/0200279 A1 * | 7/2015 | Wang | H01L 29/66833 | 438/287 |
| 2015/0206894 A1 * | 7/2015 | Chen | H01L 27/1052 | 257/316 |
| 2015/0214315 A1 * | 7/2015 | Fan | H01L 29/42324 | 257/321 |
| 2015/0236030 A1 * | 8/2015 | Wu | H01L 27/11521 | 257/316 |
| 2015/0236110 A1 * | 8/2015 | Wu | H01L 29/42348 | 257/326 |
| 2016/0035576 A1 * | 2/2016 | Bell | H01L 21/28273 | 257/326 |
| 2016/0056250 A1 * | 2/2016 | Chuang | H01L 29/42344 | 257/326 |

* cited by examiner

FLASH MEMORY AND METHOD OF MANUFACTURING THE SAME

BACKGROUND OF THE INVENTION

1. Field of the Invention

The present invention generally relates to a flash memory, and more particularly, to a flash memory having a spacer with thickness variation for preventing etch damage and method of manufacturing the same.

2. Description of the Prior Art

A non-volatile memory, such as Flash memory, retains stored data even if power to the memory is removed. A non-volatile memory cell stores data, for example, by storing, electrical charge in an electrically isolated memory gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power application.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

It is common to monolithically incorporate multiple types of field-effect devices on the same substrate as memory cells. Those non-memory devices perform, for example, decoding, charge-pumping, and other functions related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages.

Integrating the processing of memory cells, such as a split-gate memory cell, with the processing of one or more types of non-memory transistors on the same substrate is challenging as each requires different fabrication parameters.

In the manufacture of the split-gate memory cell, the oxide-nitride (ON) spacer isolating between the memory gate and select gate may be easily and seriously damaged by common etching processes. This damage issue may influence the breakdown voltage between the memory gate and select gate, which in turn impacts the overall electrical performance. Accordingly, there is a need for a memory device and methods for preventing the ON spacer damage in the process in order to maintain the performance and reliability of the memory device.

SUMMARY OF THE INVENTION

The present invention has been made in an effort to address the above-mentioned situation and circumstances that can occur in the conventional technologies. A flash memory having spacer structure with thickness variation is therefore provided in the present invention. The feature of thinner exposed ON spacers may effectively prevent the etch damage without the requirement of significant design change or excessive process cost.

One objective of the present invention is to provide a flash memory structure including a memory gate on a substrate, a select gate adjacent to the memory gate, and an oxide-nitride spacer between the memory gate and the select gate, wherein the oxide-nitride spacer further includes an oxide layer and a nitride layer having an upper nitride portion and a lower nitride portion, and the upper nitride portion is thinner than the lower nitride portion.

The other objective of the present invention is to provide a method of manufacturing a flash memory including the steps of providing a substrate, forming a gate structure with a memory gate and a nitride hard mask on the memory gate, forming an oxide-nitride spacer on the side of the memory gate, covering a photoresist layer on the gate structure and the oxide-nitride spacer, etching back the photoresist layer to expose the portion of the gate structure above the memory gate and thin the exposed nitride portion of the oxide-nitride spacer, and forming a select gate on the side of the oxide-nitride spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
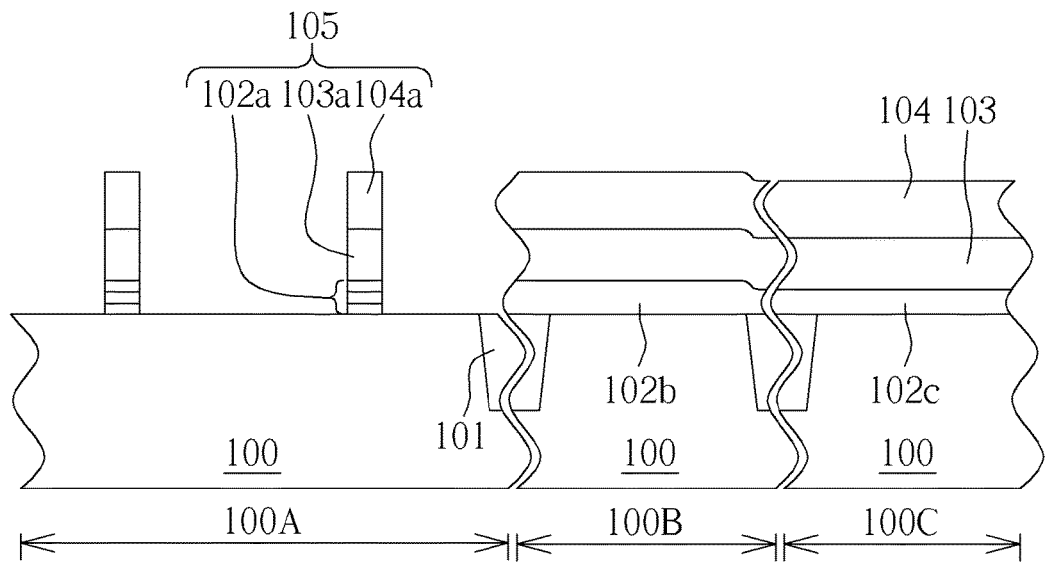
FIGS. 1-6 are cross-sectional views depicting an exemplary process flow of manufacturing a flash memory in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the, regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly though to be silicon. However, the substrate may also be any of a wide array of semiconductor materials such as germanium, gallium arsenide, indium phosphide, etc. In other embodiments, the substrate may be electrically non-conductive such as a glass or sapphire wafer.

FIGS. 1-6 are cross-sectional views depicting an exemplary process flow of manufacturing a flash memory in accordance with the embodiment of the present invention. First, please refer to FIG. 1. Memory cell/device is formed preliminarily on a substrate 100, such as silicon. Substrate 100 is commonly p-type or a p-type well while the doped source/drain regions (not shown) are n-type. However, it is also possible for substrate 100 to be n-type while the source/drain regions are p-type.

The substrate 100 is divided several regions 100A, 100B, and 100C. A first memory (array) region 100A of the substrate 100 may be used for memory components. For instance, according to the preferred embodiment, the memory region 100A may be used to form a number of select gate/memory gate pairs. High-voltage (HV) and/or logic circuitry may be formed in periphery, which includes second and third regions 100B and 100C respectively according to the preferred embodiments. The second region 100B may comprise high voltage control logic and the third region 100C may comprise low voltage control logic. The memory array region 100A, the high-voltage region 100B and the logic region 100C or the semiconductor devices formed on each region are isolated from each other by shallow trench isolation (STI) 101.

As shown in FIG. 1, a gate dielectric layer is formed on each region 100A-100C. According to the preferred embodiments, the gate dielectric layers 102a/102b/102c on different regions may be different thicknesses as shown to meet different device requirements, but this need not be the case. The gate dielectrics can be any insulating material including but not limited to oxides, nitrides, or some combination thereof. Preferably, the gate dielectric layer 102a on the memory region 100A is an oxide/nitride/oxide tri-layer stack collectively and commonly referred to as "ONO", which commonly serves as a charge trapping dielectric includes a charge trapping silicon nitride layer sandwiched between two silicon dioxide layers. Other charge trapping dielectrics may include a silicon-rich nitride film, or any film that includes, but is not limited to, silicon, oxygen, and nitrogen in various stoichiometries. The gate dielectric layer 102a/102b/102c may be formed through any well-known method. For instance, the dielectrics may be grown on the substrate 100 and comprise an oxide of the substrate material (e.g., silicon oxide).

A gate conductor layer 103 is formed on the gate dielectric layer 102. Any appropriate gate conductor material could be used to form the gate conductor layer 103 such as a polysilicon, according to the preferred embodiments. The gate conductor layer 103 may be formed or disposed according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), moleculear beam epitaxy (MBE), atomic layer deposition (ALD), and plasma-enhanced CVD (PECVD), amongst others.

A hard mask layer 104 is disposed over the gate conductor layer 103. The hard mask layer 104 may comprise any suitable material that allows for selective removal (e.g., etching) of the unmasked portion of the gate conductor layer 103. According to the preferred embodiment, the hard mask layer 104 is a silicon nitride (SiN) layer or a silicon carbon nitride (SiCN) layer.

Refer still to FIG. 1. It can be noticed that the gate dielectric layer 102a, the gate conductor layer 103, and the hard mask layer 104 in the memory region 100A are patterned to create a gate structure 105. This patterning process may comprise several conventional steps. For example, the hard mask layer 104 may be first patterned into hard mask 104a with gate patterns using photoresist. An etch process is then performed with hard mask 104a to pattern the gate conductor layer 103 and the gate dielectric layer 102a into memory gate 103a and gate dielectric. In case of blurring and confusing the key points of the present invention, the above detailed steps of patterning process are not depicted in drawings and the gate structure 105 is consequently presented in FIG. 1.

Figure 2:
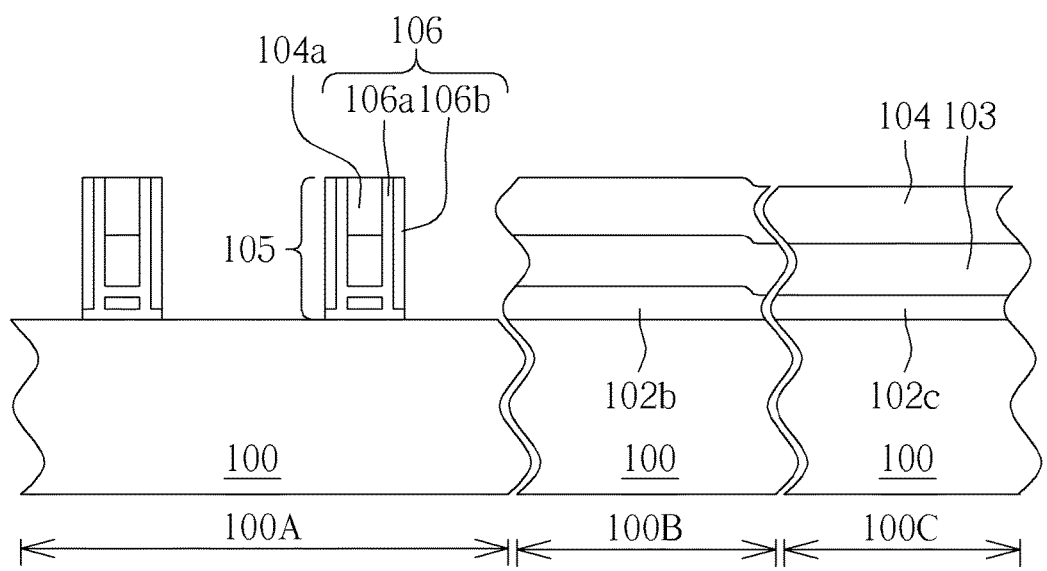

Refer now refer to FIG. 2. A spacer 106 is formed on the side of the gate structure 105. According to the preferred embodiment, the spacer 106 comprises one or more layers of dielectric such as oxide-nitride (ON), which referred as an ON spacer. The formation of ON spacer 106 may comprise several conventional steps. For example, an oxide layer 106a and a nitride layer 106b may be formed sequentially and conformally on over the gate structure 105 and the substrate 100 by well-known deposition method. The deposited, conformal oxide layer 106a and nitride layer 106b are then subject to an etch process. The etch process would remove the portion of the oxide layer and nitride layer on the plane, thus only the portion on the sidewall of the gate structure 105 is left and forms a spacer structure. Preferably, the material of the nitride layer 106b is the same as the hard mask 104a, such as silicon nitride (SiN) or silicon carbide nitride (SiCN), so that the two nitride portions can be selectively etched or removed in the same process.

Figure 3:
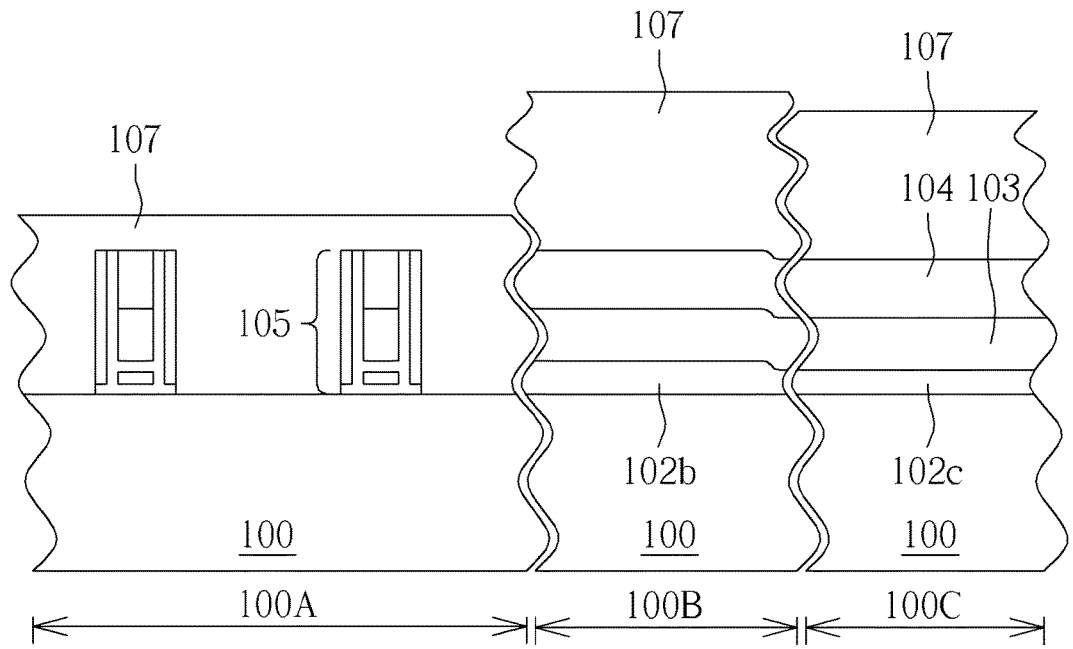

Refer now refer to FIG. 3. After forming the ON spacer 106, a sacrificial layer 107 is blanket-covered on the gate structure 105 and the substrate 100. According to the embodiment, the sacrificial layer 107 may be preferably a photoresist layer or an organic dielectric layer (ODL). The advantage of the organic dielectric is that it can be easily patterned or thinned using conventional dry etching techniques which utilize an oxygen-containing ambient. Suitable organic dielectric materials that can be employed in the invention include, but are not limited to: diamond-like carbon (DLC), fluorinated DLC, polyimides, fluorinated polyimides, parylene-N, parylene-F, benzocyclobutanes, poly(arylene ethers), polytetra-fluoroethylene (PTFE) derivatives marketed by Du Pont de Nemours, Inc. under the registered trademark Teflon AF, poly(naphthalenes), poly (norbornenes), foams of polyimides, organic xerogels, porous PTFE and other nano-, micro- or macro-porous organic materials. The photoresist layer 107 may be formed on the surface of substrate 100 using conventional deposition techniques. For example, chemical vapor deposition, plasma vapor deposition, sputtering, dip coating, spin-on coating, brushing, spraying and other like deposition techniques may be employed.

Figure 4:
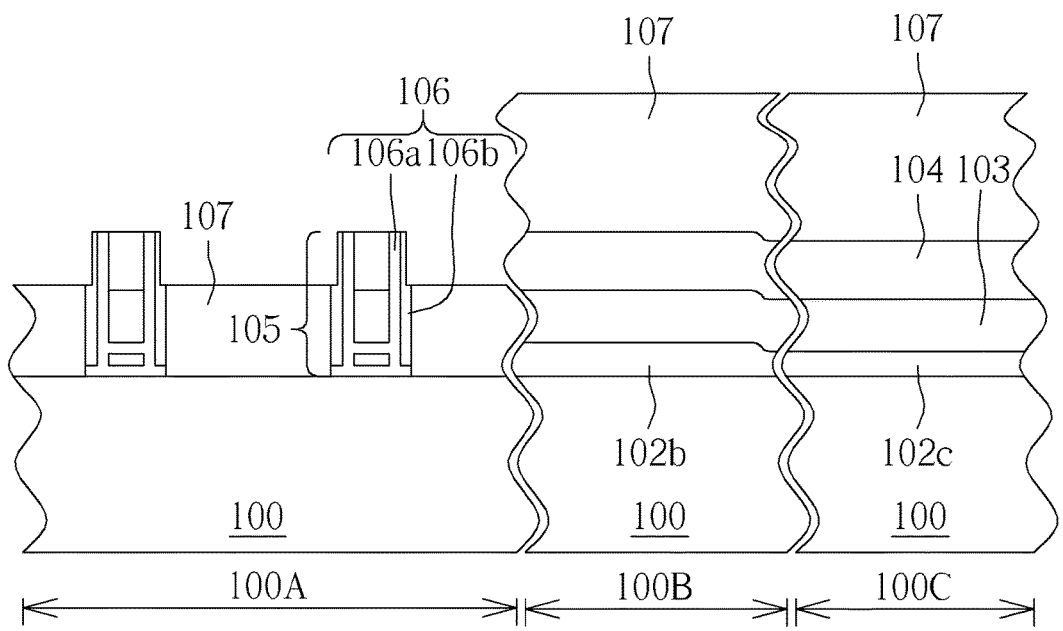

Please refer now to FIG. 4. After forming the photoresist layer 107, a blanket etching back process is performed to thin the thickness of the photoresist layer 107. According to the embodiment, the photoresist layer 107 would be thinned to the extent that the underlying gate structure 105 is exposed, and more specifically, to the extent that the surface of thinned photoresist layer 107 in memory region 100A is flush with the memory gate 103a, without affecting the unexposed nitride hard mask layer in the high-voltage region 100B and the logic region 100C.

The key feature of the above-identified thinning process of the blanket-covered photoresist layer 107 in the present invention is that it can expose a portion of the nitride layer 106b of the ON spacer 106 above the memory gate 103a. Moreover, the thinning process can thin the thickness of the exposed nitride layer 106b of the ON spacer 106 at the same time. For example, according to the preferred embodiment, the thickness of the nitride layer 106b is larger than 40 Angstroms (Å). The thinned nitride layer 106b above the top surface of the memory gate 103a is smaller than 30 Angstroms, which is about 60% of the thickness of the nitride layer 106b below the top surface of the memory gate 103a.

Figure 5:
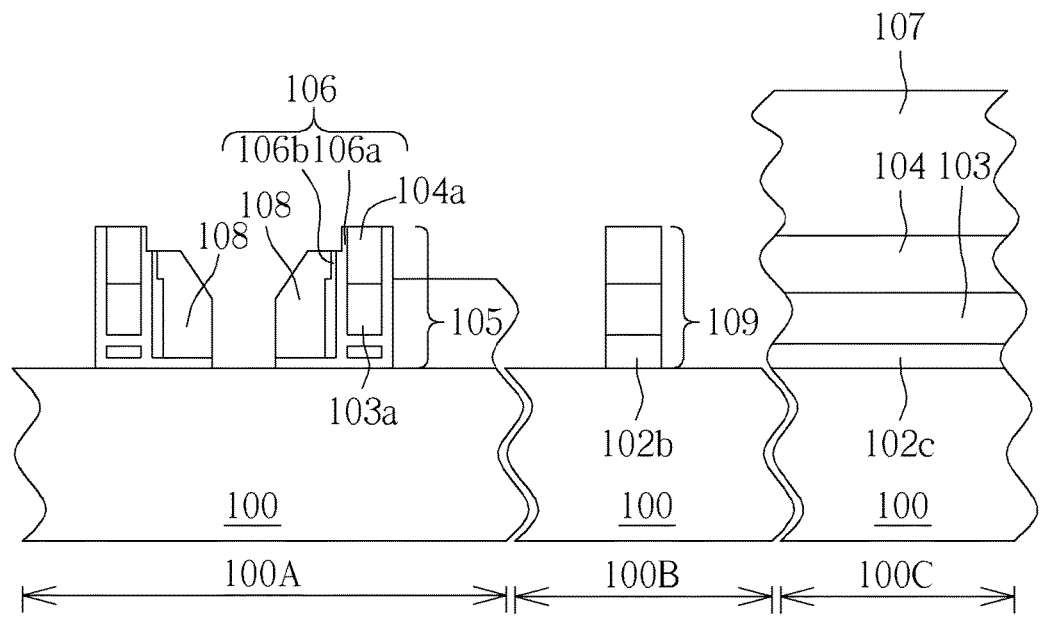

Please now refer to FIG. 5. After the thinning process, the remaining photoresist layer 107 is first completely removed by an ashing and a Caroz clean process. A select gate 108 is subsequently formed on the side of the ON spacer 106, wherein the ON spacer 106 interfaces between the memory gate 103a and the select gate 108. The formation of the select gate 108 may comprise several conventional steps. For example, a gate conductor layer (not shown) is first conformally formed over the gate structure 105 and the substrate 100. The gate conductor layer may be formed of any suitable conductor, such as polysilicon. After deposition of the gate conductor layer, the gate conductor layer may be removed from all portions of the gate structure 105 except the portion on the sidewall of one spacer 106 according to a number of well-known methods. The select gate 108 formed by the removal of these portions of the gate conductor layer is depicted in FIG. 5, which is substantially taper-shaped and higher than the memory gate 103a. In case of blurring and confusing the key points of the present invention, the above detailed steps of forming select gate 108 are not depicted in drawings and the select gate structure is consequently presented in FIG. 5.

Refer again to FIG. 5. It can also be seen in FIG. 5 that a gate structure 109 is also defined in high-voltage region 100B. The gate structure 109 may be formed by the same process flow as the gate structure 105 after forming the select gate 108. For example, first using a photoresist with gate pattern to pattern the nitride hard mask layer 104, performing a dry etch process using patterned hard mask and with photoresist covering on other regions to pattern the underlying gate conductor layer 103 and the gate dielectric layer 102b. Redundant description of similar steps is herein omitted by simplicity and clarity.

Figure 6:
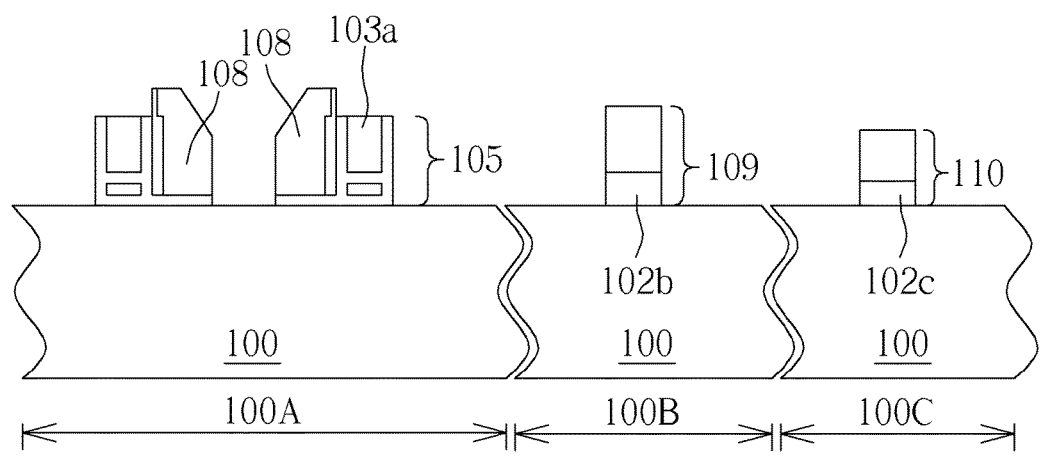
Figure 8:
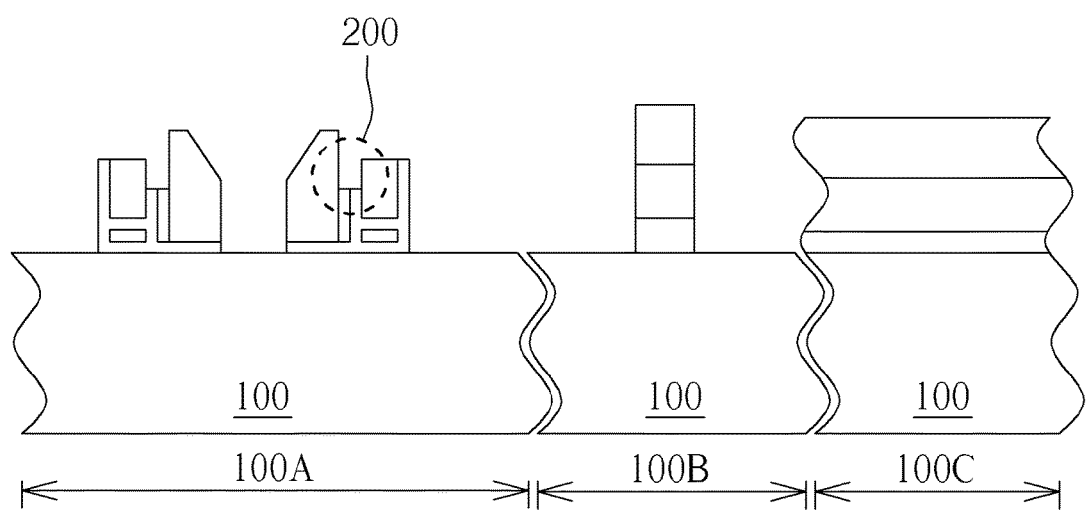
FIG. 8 is a cross-sectional view of a flash memory in prior art.

Please refer now to FIG. 6. After forming the select gate 108, the remaining hard mask 104a in memory region 100A and the hard mask layer 104 in HV region 100B and logic region 100C will be removed by a wet etching process using phosphoric acid ($H_3PO_4$) to expose the underlying memory gate 103a. This removing process reflects the critical feature and function of thinner nitride spacer. As shown in FIG. 5, the thinner upper portion of nitride layer 106b would reduce the contact area with the etchant in the wet etching process for removing the hard mask, thereby significantly mitigating the etch damage of the upper nitride portion of the ON spacer 106. The electrical performance and the reliability of the final memory device are therefore well-maintained. In comparison to the above feature, conventional spacer with larger uniform thickness is highly exposed to the etchant and prone to be damaged and depleted, like the portion 200 shown in FIG. 8. The damage portion 200 shows the condition that a portion of the select gate and memory gate is not isolated from each other by the spacer. This condition would significantly lower the breakdown voltage between the select gate and memory gate and impact the overall electrical performance.

Refer again to FIG. 6. It can also be seen that the gate structure 110 is defined in logic region 100C. The gate structure 110 may be formed by the same process flow as the gate structures 105 and 109 prior to the removal of the hard mask layer 104 in the logic region 100C. Redundant description of similar steps is herein omitted by simplicity and clarity.

Additionally, an optional wet etching process using diluted hydrofluoric acid (DHF) may be performed to remove the oxide layer above the memory gate or clean the substrate.

Figure 7:
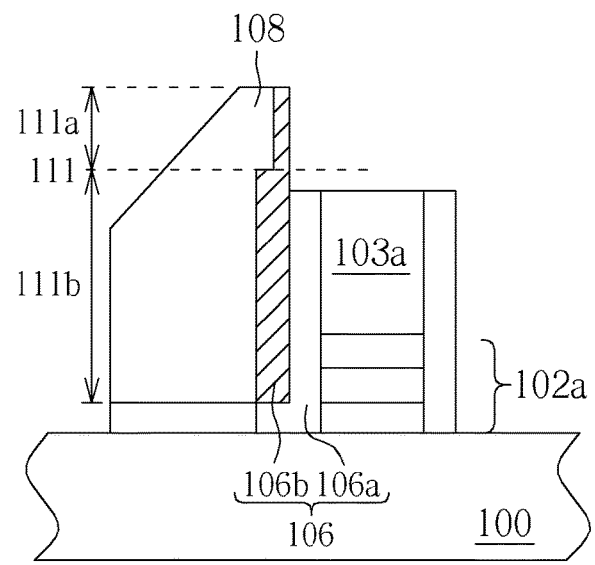
FIG. 7 is an enlarged cross-sectional view depicting an exemplary flash memory structure in accordance with the embodiment of the present invention.

According to the above-mentioned embodiments shown in FIGS. 1-6, a flash memory structure is also provided in the present invention, as shown in the enlarged cross-sectional view in FIG. 7, wherein the structure includes a memory gate 103a on a substrate 100, a select gate 108 adjacent to the memory gate 103a, wherein the height of the select gate 108 is higher than the height of the memory gate 103a. An oxide-nitride spacer 106 interfaces between the memory gate 103a and the select gate 108, wherein the oxide-nitride spacer 106 further includes an oxide layer 106a and a nitride layer 106b having an upper nitride portion 111a and a lower nitride portion 111b, and the upper nitride portion 111a is thinner than the lower nitride portion 111b. A plane 111 interfaces between the upper nitride portion 111a and the lower nitride portion 111b, wherein the plane 111 is higher than the top surface of the memory gate 103a. The height of oxide layer 106a is preferably flush with the top surface of the memory gate 103a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory, comprising:
a memory gate on a substrate;
a select gate adjacent to said memory gate, wherein said select gate comprises an upper portion and a lower portion; and
an oxide-nitride spacer between said memory gate and said select gate, wherein said oxide-nitride spacer comprises an oxide layer directly contacting said memory gate and a nitride layer having an upper nitride portion corresponding to said upper portion and a lower nitride portion corresponding to said lower portion, wherein said upper portion covers, and is in direct contact with, a topmost surface of said lower nitride portion with respect to said substrate, and a topmost surface of said upper nitride portion is higher than a topmost surface of said oxide layer with respect to said substrate, and a conformal thickness of said upper nitride portion is thinner than a conformal thickness of said lower nitride portion.

2. The flash memory of claim 1, further comprising a plane interface between said upper nitride portion and said lower nitride portion, wherein said plane is higher than the top surface of said memory gate.

3. The flash memory of claim 1, wherein a height of said oxide layer of said oxide-nitride spacer is flush with a top surface of said memory gate.

4. The flash memory of claim 1, wherein a thickness of said upper nitride portion is smaller than 60% of a thickness of said lower nitride portion.

5. The flash memory of claim 1, wherein a thickness of said upper nitride portion is smaller than 30 Angstroms.

6. The flash memory of claim 1, wherein a thickness of said lower nitride portion is larger than 40 Angstroms.

7. The flash memory of claim 1, wherein a height of said select gate is higher than a height of said memory gate.

8. The flash memory of claim 1, further comprising a gate dielectric layer between said memory gate and said substrate and between said select gate and said substrate.

9. The flash memory of claim 8, wherein said gate dielectric layer between said memory gate and said substrate is oxide/nitride/oxide tri-layer.

10. The flash memory of claim 1, wherein said nitride layer comprises silicon nitride (SiN) or silicon carbide nitride (SiCN).

11. The flash memory of claim 1, wherein said memory gate and said select gate comprise polysilicon.

12. A flash memory, comprising:
a memory gate on a substrate;
a select gate adjacent to said memory gate; and
an oxide-nitride spacer between said memory gate and said select gate, wherein said oxide-nitride spacer comprises an oxide layer directly contacting said memory gate and a nitride layer having an upper nitride portion and a lower nitride portion, wherein a topmost surface of said upper nitride portion is higher than a topmost surface of said oxide layer with respect to said substrate and is flushed with a top surface of said select gate with respect to said substrate, and a conformal thickness of said upper nitride portion is thinner than a conformal thickness of said lower nitride portion.

* * * * *